United States Patent
Liu et al.

(10) Patent No.: US 7,489,366 B2
(45) Date of Patent: Feb. 10, 2009

(54) THIN FILM TRANSISTOR ARRAY SUBSTRATE HAVING SCAN OR DATA LINES EXTENDING TO PERIPHERAL AREA WITHOUT EXCEEDING RESPECTIVELY OUTMOST DATA AND SCAN LINES FOR REDUCING ELECTROSTATIC DISCHARGE DAMAGE

(75) Inventors: Wen-Hsiung Liu, Neipu Township, Pingtung County (TW); Hui-Chung Shen, Banciao (TW); Meng-Feng Hung, Changhua (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 433 days.

(21) Appl. No.: 11/302,626

(22) Filed: Dec. 13, 2005

(65) Prior Publication Data
US 2007/0131989 A1    Jun. 14, 2007

(51) Int. Cl.
*G02F 1/136* (2006.01)
(52) U.S. Cl. .................... 349/40; 349/54; 349/149; 349/152
(58) Field of Classification Search .............. 349/39, 349/40, 54, 139, 149–152
See application file for complete search history.

(56) References Cited

U.S. PATENT DOCUMENTS

| | | | |
|---|---|---|---|
| 6,081,307 A | 6/2000 | Ha | 349/40 |
| 6,175,394 B1 | 1/2001 | Wu et al. | 349/40 |
| 2004/0207772 A1* | 10/2004 | Tomita | 349/42 |

FOREIGN PATENT DOCUMENTS

JP    2001-352069    12/2001

OTHER PUBLICATIONS

US 5,767,928, 06/1998, Ha (withdrawn)

* cited by examiner

*Primary Examiner*—David Nelms
*Assistant Examiner*—John Heyman
(74) *Attorney, Agent, or Firm*—J.C. Patents

(57) ABSTRACT

A thin film transistor (TFT) array substrate for reducing electrostatic discharge damage includes a substrate, a plurality of pixel units, scan lines and data lines. The substrate has a pixel area and a peripheral area adjacent to the pixel area. The pixel units are disposed in the pixel area. The scan lines and data lines are disposed in the pixel area of the substrate and electrically connected with the pixel units, wherein one end of each scan line extending to the peripheral area is a bonding pad for the scan line. One end of each data line extending to the peripheral area is a bonding pad for the data line. The other end of each data line extending to the peripheral area is an end part of the data line. Particularly, the end part of the data line does not exceed the outmost scan line.

11 Claims, 8 Drawing Sheets

THIN FILM TRANSISTOR ARRAY SUBSTRATE HAVING SCAN OR DATA LINES EXTENDING TO PERIPHERAL AREA WITHOUT EXCEEDING RESPECTIVELY OUTMOST DATA AND SCAN LINES FOR REDUCING ELECTROSTATIC DISCHARGE DAMAGE

BACKGROUND OF THE INVENTION

1. Field of the Invention

The present invention relates to a thin film transistor array substrate. More particularly, the present invention relates to a thin film transistor array substrate which is not be easily damaged by the discharged static electricity.

2. Description of Related Art

In recent years, with the progressive manufacturing technique in optoelectronics and semiconductor fields, the flat panel display apparatuses are growing rapidly. Wherein the liquid crystal display (LCD) apparatus has become the mainstream in the liquid crystal display apparatuses due to its low operating voltage, low radiation, light weight and thin thickness.

A traditional liquid crystal display (LCD) apparatus mainly comprises a LCD panel and a back light module, wherein the LCD panel generally comprises a thin film transistor (TFT) array substrate, a color filter (CF) array substrate and a liquid crystal layer disposed therebetween. Tiny lines and devices such as a plurality of scan lines, data lines and pixel units are formed on the TFT array substrate by the semiconductor manufacturing process.

FIG. 1 is a schematic view of a circuitry of a conventional TFT array substrate. Referring to FIG. 1, the conventional TFT array substrate 100 comprises a substrate 110, a plurality of pixel units 120, a plurality of scan lines 130 and data lines 140. The substrate 110 has a pixel area 112 and a peripheral area 114 adjacent to the pixel area 112. The pixel units 120 are disposed in the pixel area 112, wherein each pixel unit 120 is composed of a TFT 122 and a pixel electrode 124. The scan lines 130 and data lines 140 are disposed in the pixel area 112 of the substrate 110 and electrically connected with the pixel units 120, wherein one end of each scan line 130 extending to the peripheral area 114 is a bonding pad 132 for the scan line 130, and one end of each data line 140 extending to the peripheral area 114 is a bonding pad 142 for the data line 140.

FIG. 2 is an enlarged schematic view of a pixel area in area A shown in FIG. 1. Referring to FIG. 2, another end of each data line 140 extending to the peripheral area 114 is an end part 144 of the data line 140, and the end part 144 of the data line 140 is disposed over the outmost scan line 130 and exceeds the outmost scan line 130. In addition, another end of each scan line 130 extending to the peripheral area 114 is an end part 134 of the scan line 130, and the end part 134 of the scan line 130 is disposed under the outmost data line 140 and exceeds the outmost data line 140.

A plurality of electrostatic charges may be accumulated during the aforementioned manufacturing process of TFT array substrate 100, for example, especially when the manufacturing equipment and the operators touch the TFT array substrate 100 frequently. However, when the electrostatic charges on the TFT array substrate 100 are accumulated to a critical value will lead to generate the electrostatic discharge phenomenon.

More specifically, a manufacturing process of the data line 140 shown in FIG. 2 comprises the following steps. First, a metal film (not shown) is formed completely over the substrate 110. And then the metal film is photo-lithographed and etched to form the data line 140. It should be noted that during the manufacturing process of the metal film, because a large number of electrostatic charges are accumulated in the manufacturing equipment and an end part of a semiconductor layer (not shown) is located under the end part 144 of the data line 140, a plurality of electrostatic charges can be easily accumulated on the end part of the semiconductor layer, so as to damage the end part of the semiconductor layer.

Therefore, after the metal film is photo-lithographed and etched to form the data line 140, the end part 144 of the data line 140 touches with the end part of the semiconductor layer damaged by the electrostatic charges. So the short-circuit between the data line 140 and the scan line 130 is generated and leads to some defects of display quality such as white lines or black lines shown on a display panel.

In addition, because the lines and devices on the TFT array substrate 100 are so tiny, the main circuits and devices will be vulnerable to the electrostatic discharge phenomenon. It should be noted that the electrostatic charges are easily concentrated on the end part 134 of the scan line 130 and the end part 144 of the data line 140 shown in FIG. 2 and then the electrostatic discharge phenomenon is generated. Therefore, the short-circuit between the different layers (upper layer and lower layer) of lines will be generated due to the high voltage resulted from the point discharge on the end part 134 of the scan line 130 and the end part 144 of the data line 140, so the TFT array substrate 100 can not function well.

In order to reduce the foregoing adverse effect, damaged by electrostatic charges, a plurality of electrostatic protection devices (not shown) are disposed in the peripheral area 114 of the TFT array substrate 100, wherein the protection devices are electrically connected with the source lines and the gate lines in series via a plurality of switch devices. When the electrostatic charges on the lines of the substrate 100 or in the pixel unit 120 exceed a critical value, the switch devices are opened and disperse the electrostatic charges to the electrostatic protection devices to lower the electrostatic discharge phenomenon. However, the layout of the peripheral area 114 is complicated by utilizing the above-mentioned method, disposing the electrostatic protection devices, so that the area of layout is not enough. Hence, it has an adverse effect in simplifying the manufacturing process and enhancing the production efficiency.

SUMMARY OF THE INVENTION

Accordingly, the present invention is directed to a thin film transistor array substrate for reducing electrostatic discharge damage, wherein the thin film transistor array substrate is capable of reducing electrostatic discharge phenomenon and simplifying the layout of the TFT array substrate to enhance the production efficiency.

According to an embodiment of the present invention, a TFT array substrate for reducing electrostatic discharge damage is disclosed. It comprises a substrate, a plurality of pixel units, a plurality of scan lines and a plurality of data lines. The substrate has a pixel area and a peripheral area adjacent to the pixel area. The pixel units are disposed in the pixel area. The scan lines and the data lines are disposed in the pixel area of the substrate. The scan lines and the data lines are electrically connected with the pixel units, wherein one end of each scan line extending to the peripheral area is a bonding pad for the scan line, and one end of each data line extending to the peripheral area is a bonding pad for the data line. And wherein another end of each data line extending to the peripheral area is an end part of the data line, and the end part of the data line does not exceed the outmost scan line.

According to an embodiment of the present invention, the TFT array substrate further comprises a plurality of semiconductor lines. The semiconductor lines are disposed under the data lines, wherein each of the semiconductor lines has an end part.

According to an embodiment of the present invention, the end part of the semiconductor line is located over the outmost data line and does not exceed the outmost scan line.

According to an embodiment of the present invention, the semiconductor lines exceed the outmost scan line.

According to an embodiment of the present invention, the TFT array substrate further comprises a plurality of floating conductors. Each of the floating conductors is disposed between one end part of the semiconductor line and the substrate. The floating conductors and the scan lines are the same metal layer.

According to an embodiment of the present invention, wherein a shape of the end part of the semiconductor line comprises a linear shape or T character-shape.

According to an embodiment of the present invention, wherein another end of each scan line extending to the peripheral area is an end part of the scan line, and the end part of the scan line is located under the outmost data line and does not exceed the outmost data line.

According to an embodiment of the present invention, wherein each of the pixel units comprises a thin film transistor and a pixel electrode.

According to an embodiment of the present invention, another TFT array substrate for reducing electrostatic discharge damage is disclosed. It comprises a substrate, a plurality of pixel units, a plurality of scan lines and a plurality of data lines. The substrate has a pixel area and a peripheral area adjacent to the pixel area. The pixel units are disposed in the pixel area. The scan lines and the data lines are disposed in the pixel area of the substrate. The scan lines and the data lines are electrically connected with the pixel units, wherein one end of each scan line extending to the peripheral area is a bonding pad for the scan line, and one end of each data line extending to the peripheral area is a bonding pad for the data line. And wherein another end of each scan line extending to the peripheral area is an end part of the scan line, and the end part of the scan line does not exceed the outmost data line.

According to an embodiment of the present invention, wherein each of the pixel units comprises a thin film transistor and a pixel electrode.

Because the present invention has the design, the end part of the data line does not exceed the outmost scan line, and has another design, the end part of the scan line does not exceed the outmost data line, the point discharge phenomenon is reduced. In addition, the electrostatic charges accumulated on the end part of the scan line or data line can be directly transmitted and decreased through the pixel units located on the peripheral area on the TFT array substrate. Hence, the antistatic devices are not required to be disposed on the peripheral area on the TFT array substrate of the present invention, that is, the TFT array substrate of the present invention has the antistatic ability. Furthermore, the simplified layout of the TFT array substrate enables the present invention to promote its production efficiency.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE EMBODIMENTS

Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

Figure 1:
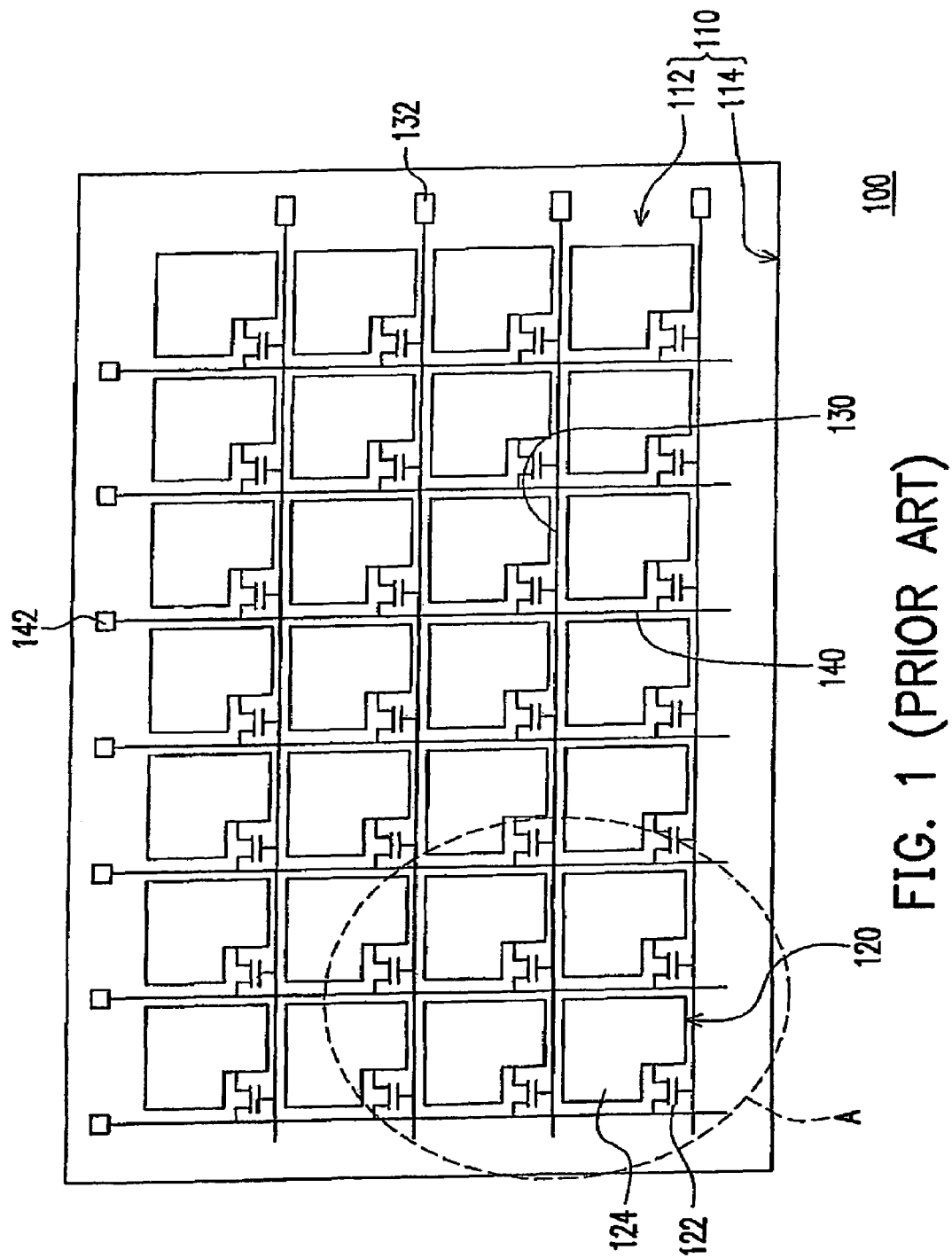
FIG. 1 is a schematic view of a circuitry of a conventional TFT array substrate.
Figure 2:
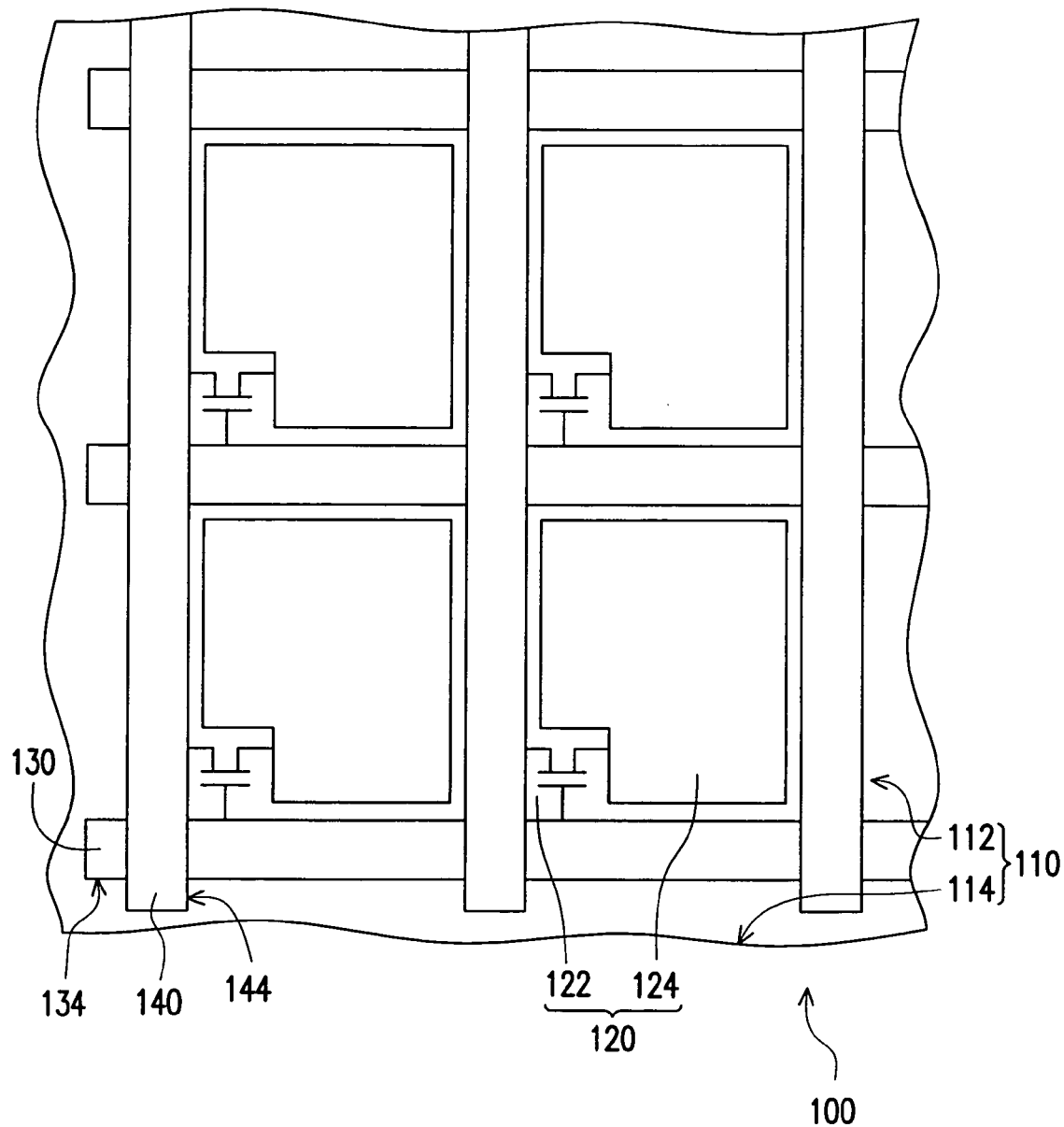
FIG. 2 is an enlarged schematic view of a pixel area in area A shown in FIG. 1.
Figure 3:
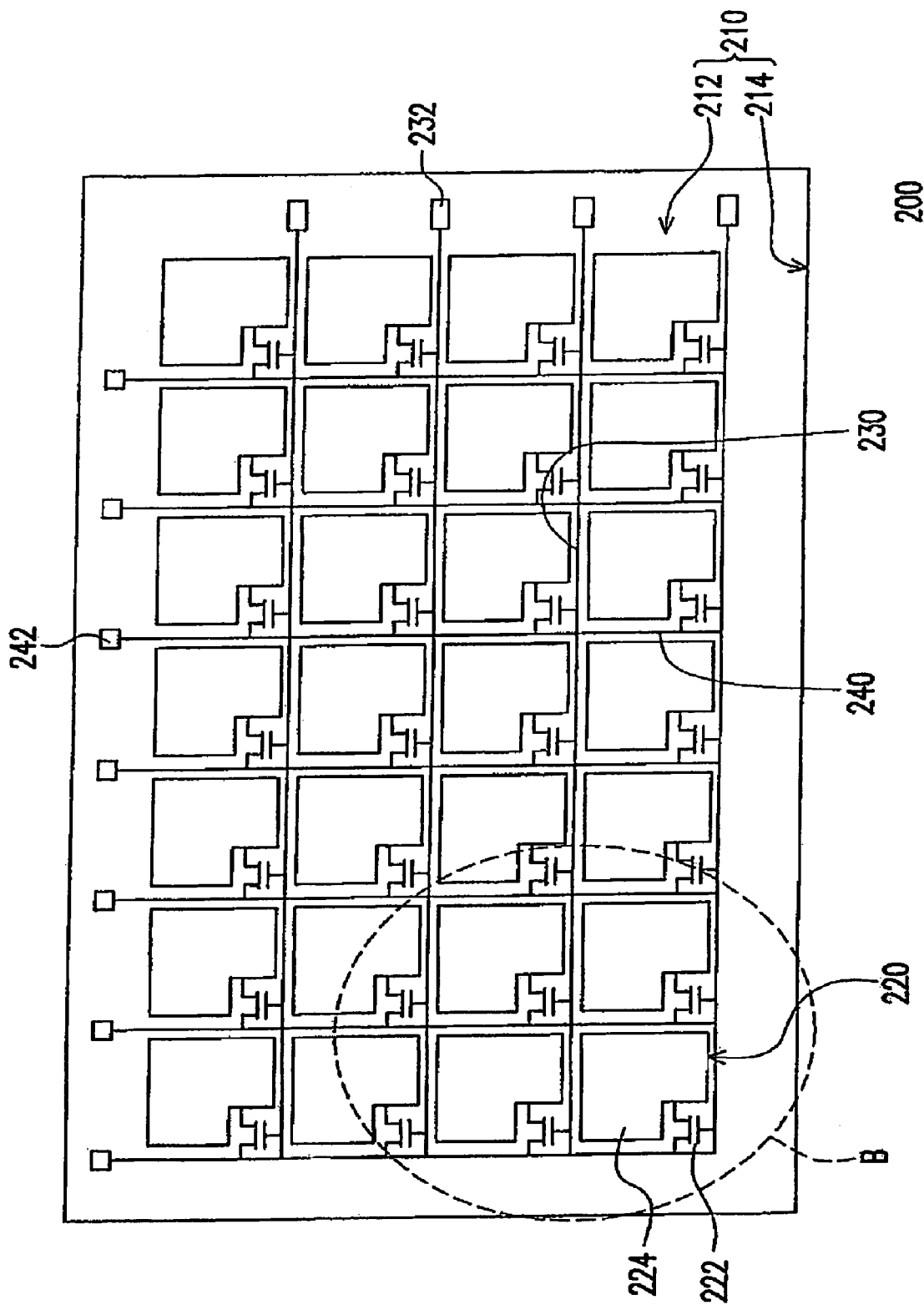
FIG. 3 is a schematic view of a TFT array substrate according to one preferred embodiment of the present invention.
Figure 4:
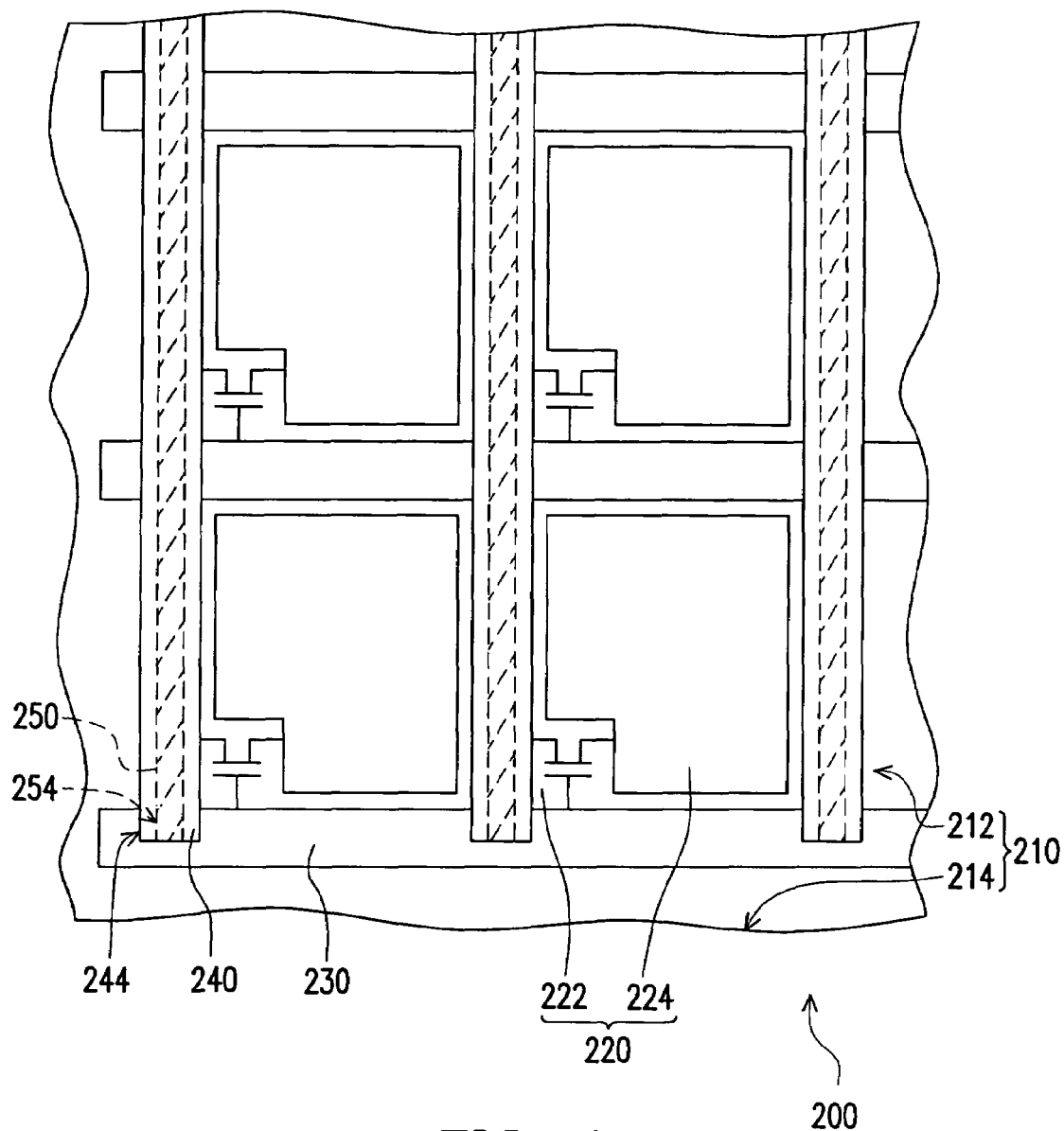
FIG. 4 is an enlarged schematic view of a pixel area in area B shown in FIG. 3.

FIG. 3 is a schematic view of a TFT array substrate according to one preferred embodiment of the present invention. FIG. 4 is an enlarged schematic view of a pixel area in area B shown in FIG. 3. Referring to FIGS. 3 and 4, the conventional TFT array substrate 200 comprises a substrate 210, a plurality of pixel units 220, a plurality of scan lines 230 and a plurality of data lines 240. The substrate 210 has a pixel area 212 and a peripheral area 214 adjacent to the pixel area 212. The pixel units 220 are disposed in the pixel area 212. The scan lines 230 and the data lines 240 are disposed in the pixel area 212 of the substrate 210 and the scan lines 230 and the data lines 240 are electrically connected with the pixel units 220, wherein one end of each scan line 230 extending to the peripheral area 214 is a bonding pad 232 for the scan line 230, and one end of each data line 240 extending to the peripheral area 214 is a bonding pad 242 for the data line 240. As shown in FIG. 4, another end of each data line 240 extending to the peripheral area 214 is an end part 244 of the data line 240, and the end part 244 of the data line 240 does not exceed the outmost scan line 230. In addition, each of the pixel units 220 comprises a thin film transistor 222 and a pixel electrode 224, for example.

It should be noted that because the end part 244 of the data line 240 does not exceed the outmost scan line 230, the electrostatic charges accumulated on the end part 244 of the data line 240 can be transmitted to the pixel units 220 near the peripheral area 214. The pixel units 220 disposed near the peripheral area 214 is usually served as a dummy pixel, even when the dummy pixel is damaged due to the electrostatic discharge, the display panel will still function or display normally. Therefore, the design of the present invention, the end part 244 of the data line 240 is shortened and located above the scan lines 230, can reduce the short-circuit between the data lines 240 and the scan lines 230 resulted from the electrostatic discharge.

Referring to FIG. 4, in another embodiment of the present invention, the TFT array substrate 200 further comprises a plurality of semiconductor lines 250, for example. The semiconductor lines 250 are disposed under the data lines 240 respectively, and each of the semiconductor lines 250 has an end part 254 of the semiconductor line 250. As shown in FIG. 4, it should be noted that the end part 254 of the semiconductor line 250 is located over the outmost scan line 230 and does not exceed the outmost scan line 230. The electrostatic charges will be diminished in the semiconductor lines 250 because the semiconductor lines 250 have the semiconductor characteristics, i.e. electrical conductivity but higher electrical impedance than common conductors. Therefore, the electrostatic charges are not easily accumulated in the end part 244 of the data line 240 so as to reduce the electrostatic discharge phenomenon. In other words, the TFT array substrate 200 of the present invention has the electrostatic protection ability.

More specially, during a manufacturing process of the TFT array substrate 200, a manufacturing process of the data line 240 shown in FIG. 4 comprises the following steps. First, a metal film (not shown) is formed completely over the substrate 210. And then the metal film is photo-lithographed and etched to form the data line 240. It should be noted that during the manufacturing process of the metal film, the end part 254 of the semiconductor line 250 is located over the scan line 230. Although a plurality of electrostatic charges are easily accumulated on the end part 254 of the semiconductor line 250, the electrostatic discharge damage is not generated on the end part 254 because the semiconductor line 250 does not exceed the outmost scan line 230.

After the metal film is photo-lithographed and etched to form the data line 240, because the electrostatic discharge damage is not generated on the semiconductor lines 250, the short-circuit between the data line 240 and the scan line 230 does not occur and some defects of display quality such as white lines or black lines shown on a display panel are not generated.

Figure 5:
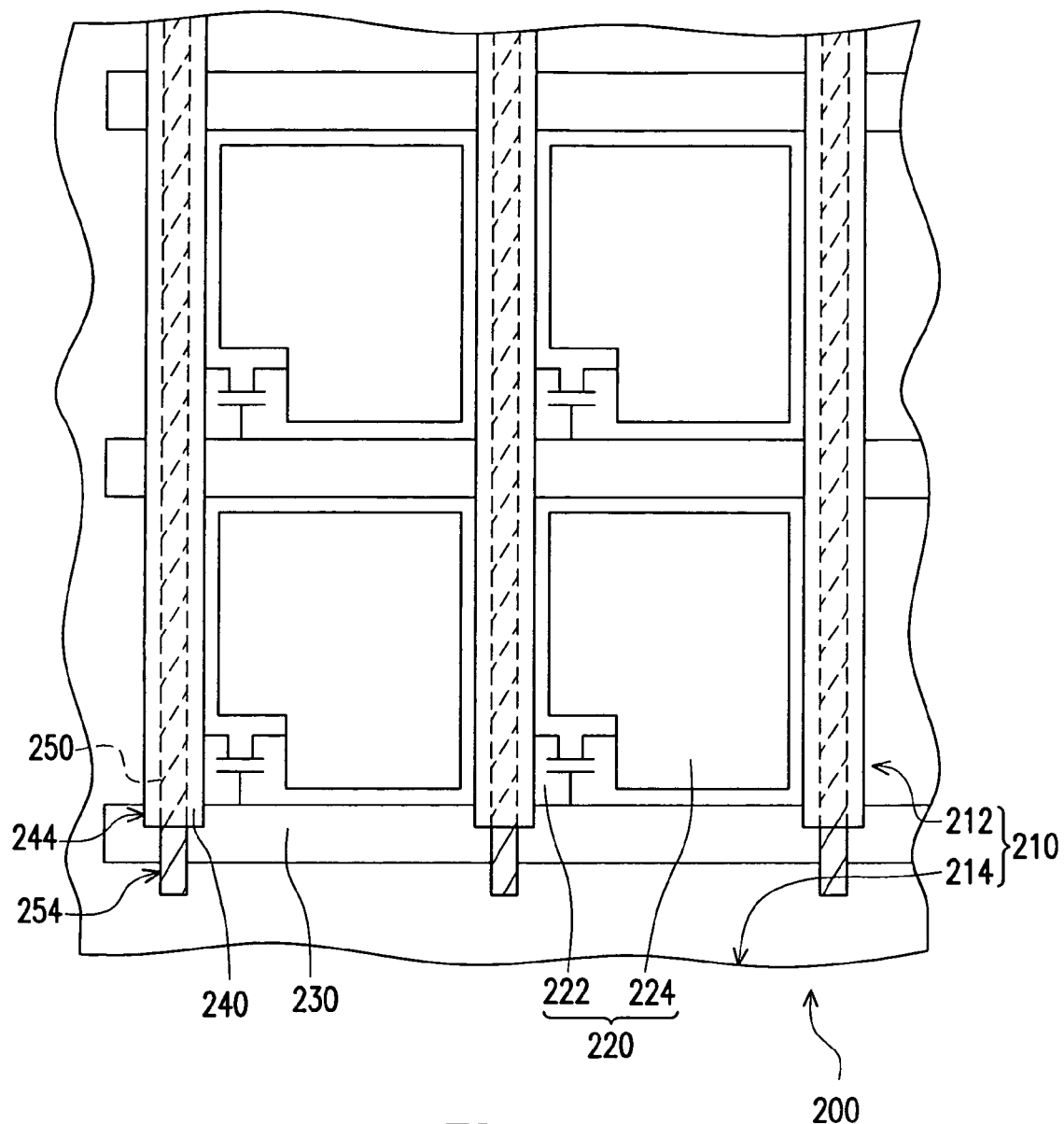
FIG. 5 is an enlarged schematic view of a portion of a TFT array substrate according to another preferred embodiment of the present invention.

FIG. 5 is an enlarged schematic view of a portion of a TFT array substrate according to another preferred embodiment of the present invention. Referring to FIG. 5, in this embodiment, the end part 244 of the data line 240 is disposed over the outmost scan line 230, and does not exceed the outmost scan line 230, however, the semiconductor lines 250 exceed the outmost scan line 230 so that the end part 254 of the semiconductor line 250 exceeds the outmost scan line 230. According to the foregoing design, the electrostatic charges can be transmitted into the end part 254 of the semiconductor line 250. In addition, the electrostatic charges are diminished in the semiconductor lines 250 because the semiconductor lines 250 have the semiconductor characteristics, which are electrical conductivity but higher electrical impedance than common conductors. Therefore, the point discharge phenomenon can be further reduced.

More specially, during a manufacturing process of the TFT array substrate 200, a manufacturing process of the data line 240 shown in FIG. 5 comprises the following steps. First, a metal film (not shown) is formed completely over the substrate 210. And then the metal film is photo-lithographed and etched to form the data line 240. It should be noted that during the manufacturing process of the metal film, because the semiconductor line 250 exceeds over the outmost scan line 230, so a plurality of electrostatic charges are easily accumulated on the end part 254 of the semiconductor line 250 to generate the electrostatic discharge damage on the end part 254, so as to decrease some electrostatic charges located on the scan line 230.

After the metal film is photo-lithographed and etched to form the data line 240, even though the end part 254 of the semiconductor line 250 is damaged by a plurality of electrostatic charges, the short-circuit between the data line 240 and the scan line 230 is not generated and some defects of display quality such as white lines or black lines shown on a display panel do not occur because the data line 240 does not touch with the end part 254 of the semiconductor line 250 damaged by the electrostatic charges.

Figure 6A:
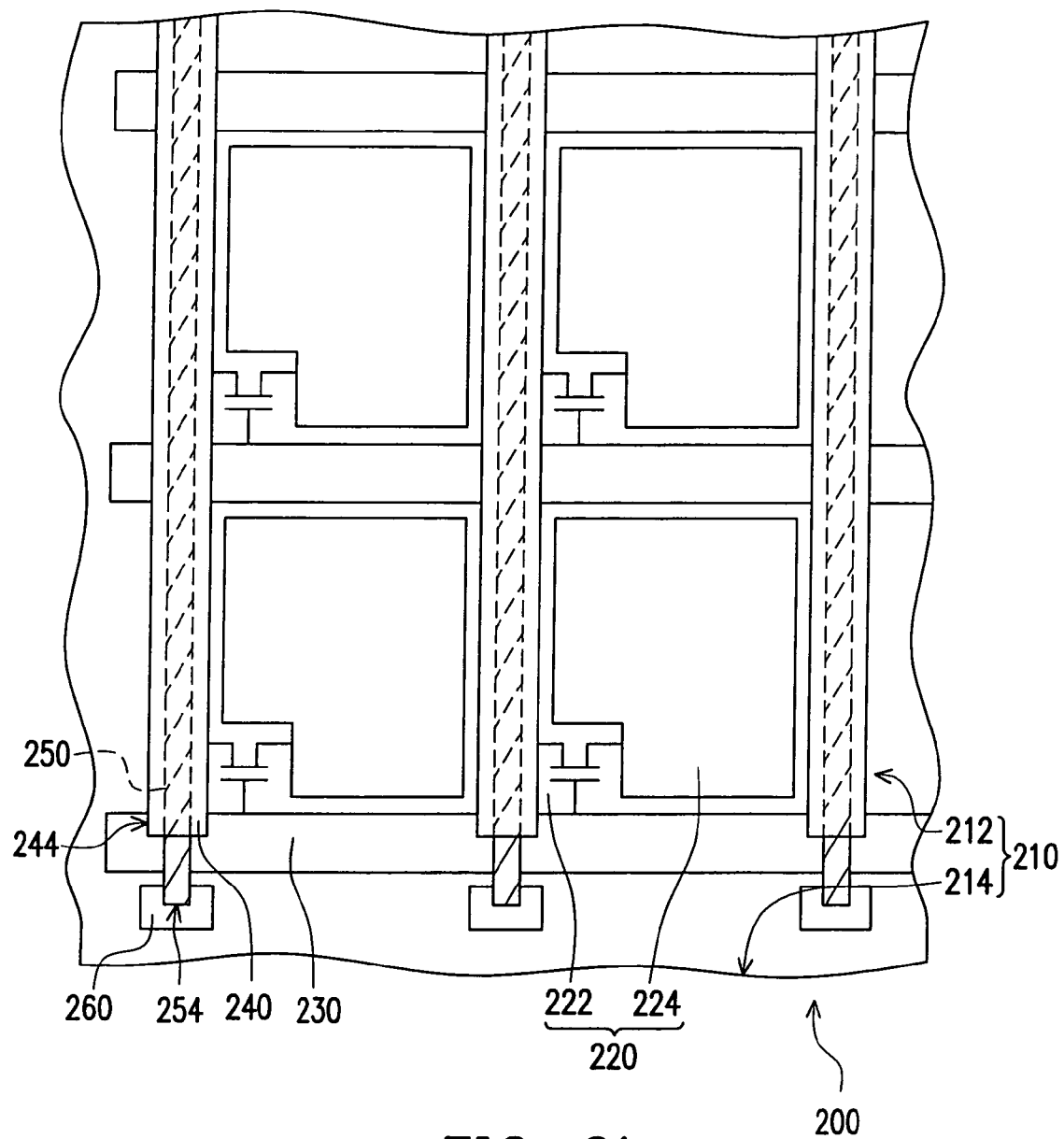
FIGS. 6A and 6B are enlarged schematic views of portions of two TFT array substrates respectively according to other preferred embodiments of the present invention.
Figure 6B:
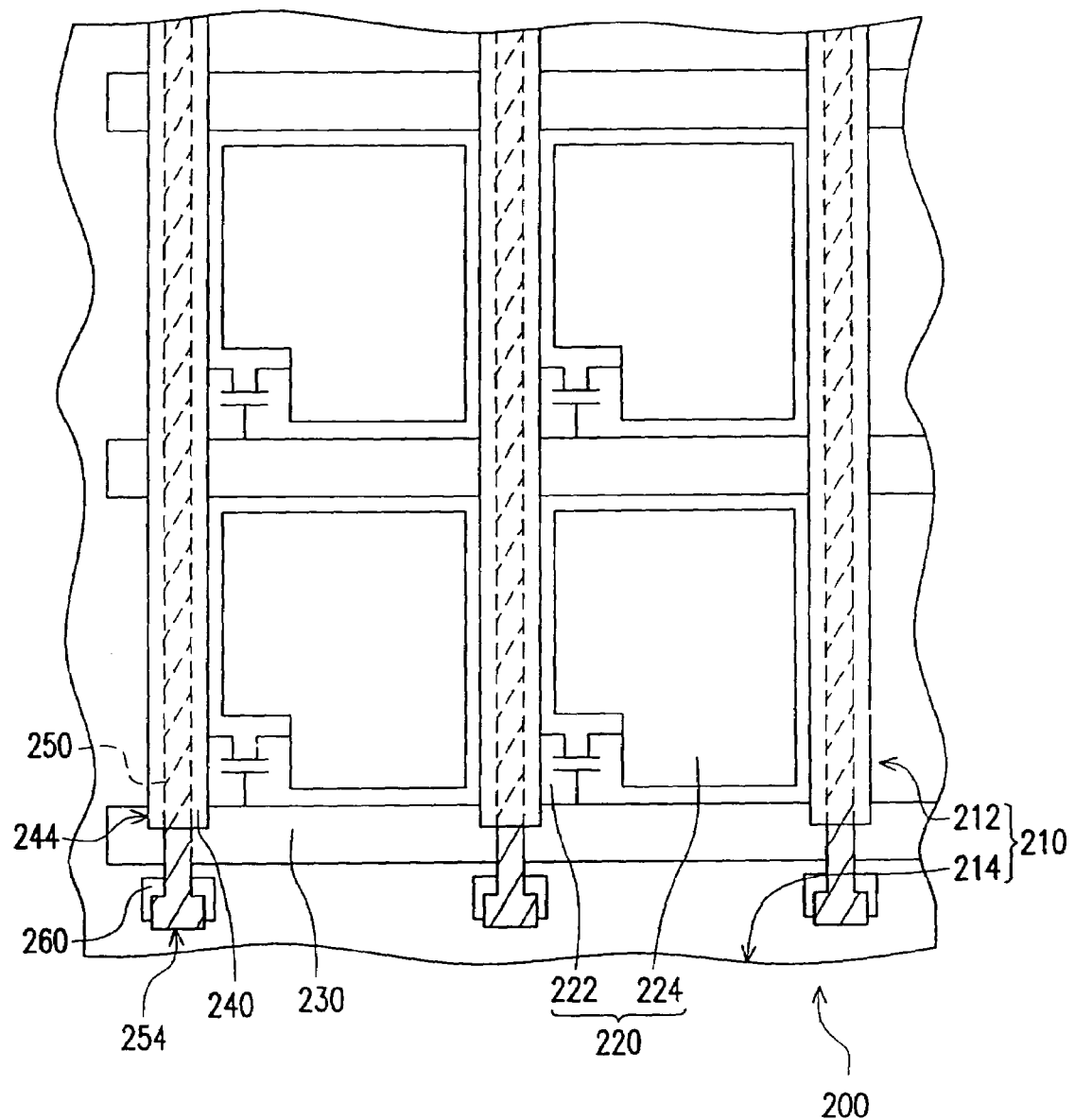

However, the foregoing electrostatic charges located on the end part 254 of the semiconductor line 250 may flow upward along the semiconductor line 250, so the portion of the semiconductor line 250 damaged by the electrostatic charges may contact with the end part 244 of the data line 240 to generate the short-circuit between the scan line 230 and the data line 240. FIGS. 6A and 6B are enlarged schematic views of portions of two TFT array substrates respectively according to other preferred embodiments of the present invention. Referring to FIGS. 6A and 6B, in these embodiments, besides the layout of circuitry shown in FIG. 5, the TFT array substrate 200 further comprises a plurality of floating conductors 260. The floating conductors 260 are disposed between the end part 254 of the semiconductor line 250 and the substrate 210 correspondingly, wherein the floating conductors 260 and the scan lines 230 are the same metal layers. Besides the electrostatic charges can be transmitted and reduced in the semiconductor lines 250, even when the electrostatic charges are accumulated in the end part 254 of the semiconductor line 250, the electrostatic charges can be further transmitted to the floating conductors 260 and then diminished due to the electrical connection between the floating conductors 260 and the end part 254 of the semiconductor line 250. It should be note that the shapes of end part 254 of the semiconductor lines 250 can be linear shape shown in FIG. 6A or the T-character shape shown in FIG. 6B. However, the shapes of end part 254 of the semiconductor line 250 are not limited to the above-mentioned two shapes (linear shape and T-character shape), they also can be round shapes or polygon. In other words, no matter what the shapes of the part 254 of the semiconductor line 250 are, when the end part 254 of the semiconductor line 250 and the floating conductor 260 are electrically connected with each other and the contact area thereof are as larger as possible, the electrostatic charges will be easily transmitted and diminished.

More specially, during a manufacturing process of the TFT array substrate 200, a manufacturing process of the data line 240 shown in FIG. 6A or 6B comprises the following steps. First, a metal film (not shown) is formed completely over the substrate 210. And then the metal film is photo-lithographed and etched to form the data line 240. It should be noted that during the manufacturing process of the metal film, because the semiconductor line 250 exceeds over the outmost scan line 230 and electrically connects with the floating conductor 260, the electrostatic discharge damage will be easily generated on the floating conductor 260, so as to decrease some electrostatic charges located on the scan line 230.

After the metal film is photo-lithographed and etched to form the data line 240, even though the end part 254 of the semiconductor line 250 located on the floating conductor 260 is damaged by a plurality of electrostatic charges, the short-circuit between the data line 240 and the scan line 230 is not generated and some defects of display quality such as white lines or black lines shown on a display panel do not occur because the data line 240 does not touch with the end part 254 of the semiconductor lines 250 damaged by the electrostatic charges.

Figure 7:
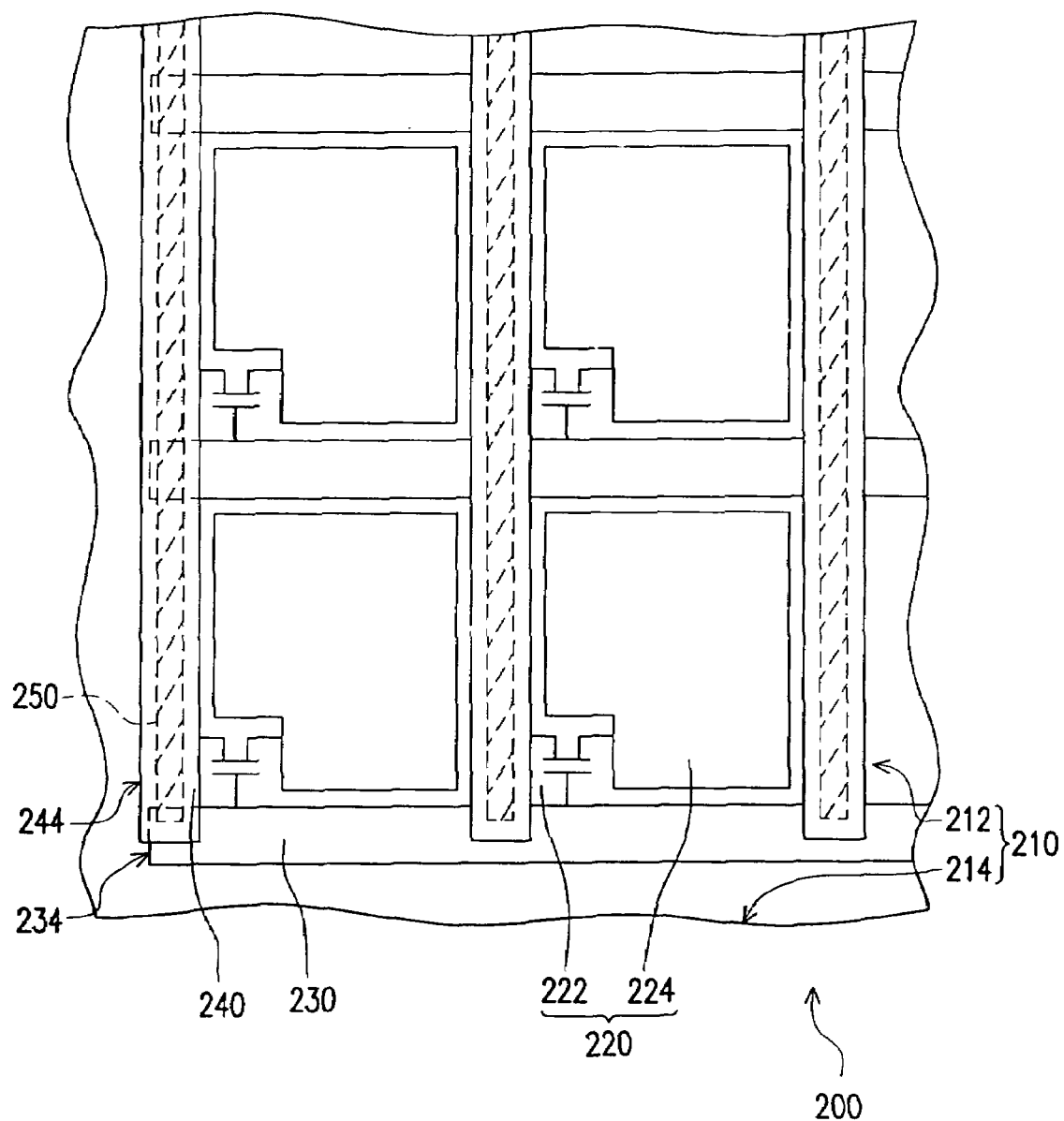
FIG. 7 is an enlarged schematic view of a portion near the peripheral area of a TFT array substrate according to one preferred embodiment of the present invention.

The above-mentioned design of the data lines can also be applied to the scan lines, illustrated as followings. FIG. 7 is an enlarged schematic view of a portion near the peripheral area of a TFT array substrate according to one preferred embodiment of the present invention. Referring to FIG. 7, another end of each scan line 230 extending to the peripheral area 214 is an end part 234 of the scan line 230, and the end part 234 of the scan line 230 is disposed under the outmost data line 240, and does not exceed the outmost data line 240. According to the design, the electrostatic charges can be transmitted to the neighboring dummy pixel to reduce the electrostatic discharge phenomenon resulted in the short-circuit between the scan lines 230 and the data lines 240. Undoubtedly, the design that the end part 234 of the scan line 230 shown in FIG. 7 located under the outmost data line 240 and not exceed the outmost data line 240 can also be utilized in the TFT array substrates 200 shown in FIGS. 3, 4, 5, 6A and 6B, so as to reduce the point discharge phenomenon from the end part 234 of the scan line 230 and the end part 244 of the data line 240.

In summary, the present invention, the TFT array substrate, has the following advantages:

(1). By utilizing the design that an end part of the data line is disposed over the outmost scan line and does not exceed the outmost scan line, and by using the design that the end part of the scan line is disposed under the outmost data line and does not exceed the outmost data line, the short-circuit between the data lines and the scan lines resulted from the electrostatic discharge can be decreased.

(2). The semiconductor lines and the floating conductors designed in the present invention can enhance electrostatic transmission so as to decrease the electrostatic accumulation.

(3). Because the electrostatic protection devices are not required to be disposed on the peripheral area in the present invention, the layout of circuitry of the peripheral area can be simplified and then the production efficiency of the TFT array substrate will be further enhanced.

120 The above description provides a full and complete description of the embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A thin film transistor array substrate for reducing electrostatic discharge damage, comprising:
   a substrate, having a pixel area and a peripheral area adjacent to the pixel area;
   a plurality of pixel units, disposed in the pixel area; and
   a plurality of scan lines and data lines, disposed in the pixel area of the substrate and electrically connected with the pixel units, wherein one end of each scan line extending to the peripheral area is a bonding pad for the scan line, and one end of each data line extending to the peripheral area is a bonding pad for the data line, and
   wherein another end of each data line extending to the peripheral area is an end part of the data line, and the end part of the data line does not exceed the outmost scan line.

2. The thin film transistor array substrate of claim 1, further comprising a plurality of semiconductor lines, wherein each of the semiconductor lines is disposed under one of the data lines, and each of the semiconductor lines has an end part of the semiconductor line.

3. The thin film transistor array substrate of claim 2, wherein the end part of the semiconductor line is located over the outmost scan line and does not exceed the outmost scan line.

4. The thin film transistor array substrate of claim 2, wherein the semiconductor line exceeds the outmost scan line.

5. The thin film transistor array substrate of claim 4, further comprising a plurality of floating conductors, wherein each of the floating conductors is disposed between one end part of the semiconductor line and the substrate.

6. The thin film transistor array substrate of claim 5, wherein the floating conductors and the scan lines are the same metal layer.

7. The thin film transistor array substrate of claim 2, wherein a shape of the end part of the semiconductor line comprises a linear shape or T character-shape.

8. The thin film transistor array substrate of claim 1, wherein another end of each scan line extending to the peripheral area is an end part of the scan line, and the end part of the scan line is located under the outmost data line and does not exceed the outmost data line.

9. The thin film transistor array substrate of claim 1, wherein each of the pixel units comprises a thin film transistor and a pixel electrode.

10. A thin film transistor array substrate for reducing electrostatic discharge damage, comprising:
    a substrate, having a pixel area and a peripheral area adjacent to the pixel area;
    a plurality of pixel units, disposed in the pixel area; and
    a plurality of scan lines and data lines, disposed in the pixel area of the substrate and electrically connected with the pixel units, wherein one end of each scan line extending to the peripheral area is a bonding pad for the scan line, and one end of each data line extending to the peripheral area is a bonding pad for the data line, and
    wherein another end of each scan line extending to the peripheral area is an end part of the scan line, and the end part of the scan line does not exceed the outmost data line.

11. The thin film transistor array substrate of claim 10, wherein each of the pixel units comprises a thin film transistor and a pixel electrode.

* * * * *